(12) United States Patent
Menath et al.

(10) Patent No.: US 9,780,161 B2
(45) Date of Patent: Oct. 3, 2017

(54) TRANSFORMER COMPRISING A ROUNDED COIL

(71) Applicant: Infineon Technologies AG, Neubiberg (DE)

(72) Inventors: Markus Menath, Regensburg (DE); Thomas Fischer, Regensburg (DE); Hermann Wendt, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/837,880

(22) Filed: Aug. 27, 2015

(65) Prior Publication Data

US 2015/0372073 A1 Dec. 24, 2015

Related U.S. Application Data

(62) Division of application No. 13/452,669, filed on Apr. 20, 2012, now Pat. No. 9,183,977.

(51) Int. Cl.
*H01F 17/02* (2006.01)
*H01F 38/14* (2006.01)
(Continued)

(52) U.S. Cl.
CPC ......... *H01L 28/10* (2013.01); *H01F 17/0006* (2013.01); *H01F 17/02* (2013.01); *H01F 41/042* (2013.01); *H01L 21/76816* (2013.01); *H01L 23/5227* (2013.01); *H01L 23/64* (2013.01); *H01L 21/0274* (2013.01); *H01L 21/76804* (2013.01); *H01L 21/76877* (2013.01); *H01L 23/5283* (2013.01); *H01L 27/08* (2013.01); *H01L 2224/48095* (2013.01); *H01L 2224/48137* (2013.01); *Y10T 29/4902* (2015.01)

(58) Field of Classification Search
CPC ........................... H01L 28/10; H01L 23/5227
See application file for complete search history.

(56) References Cited

U.S. PATENT DOCUMENTS 4,906,590 A * 3/1990 Kanetaki ............. H01L 21/0274
257/304
5,795,823 A * 8/1998 Avanzino .......... H01L 21/76807
257/E21.507
(Continued)

FOREIGN PATENT DOCUMENTS

CN 1866523 A 11/2006
DE 102008035993 A1 2/2010
WO 2008040179 A1 4/2008

OTHER PUBLICATIONS

Munzer et al., "Coreless transformer a new technology for half bridge driver IC's," Infineon Technologies, Muenchen, Germany, May 17, 2006, pp. 1-4.
(Continued)

*Primary Examiner* — Victor A Mandala
*Assistant Examiner* — Regan J Rundio
(74) *Attorney, Agent, or Firm* — Slater Matsil, LLP

(57) ABSTRACT

A method for manufacturing an electronic device and an electronic device are disclosed. In an embodiment the method comprises forming an opening in an isolation layer, isotropically etching the opening thereby forming an extended opening with curved sidewalls, and forming a conductive material in the opening.

19 Claims, 12 Drawing Sheets

(51) Int. Cl.
- *H01L 23/522* (2006.01)
- *H01L 23/64* (2006.01)
- *H01L 49/02* (2006.01)
- *H01F 17/00* (2006.01)
- *H01F 41/04* (2006.01)
- *H01L 23/528* (2006.01)
- *H01L 27/08* (2006.01)
- *H01L 21/768* (2006.01)
- *H01L 21/50* (2006.01)
- *H01L 21/02* (2006.01)
- *H01L 21/027* (2006.01)

(56) References Cited

U.S. PATENT DOCUMENTS

| | | | |
|---|---|---|---|
| 6,093,330 | A | 7/2000 | Chong et al. |
| 6,249,039 | B1* | 6/2001 | Harvey ............... H01F 17/0006 257/528 |
| 6,313,008 | B1 | 11/2001 | Leung et al. |
| 6,724,290 | B1* | 4/2004 | Ohnmacht .......... H01F 17/0006 257/531 |
| 6,833,079 | B1 | 12/2004 | Giordani |
| 6,960,519 | B1* | 11/2005 | Dalton .............. H01L 21/76804 257/E21.578 |
| 7,470,927 | B2* | 12/2008 | Lee ..................... H01L 23/3114 174/524 |
| 7,582,532 | B2 | 9/2009 | Han et al. |
| 7,834,575 | B2 | 11/2010 | Hauenstein |
| 7,884,444 | B2 | 2/2011 | Strzalkowski |
| 8,049,301 | B2 | 11/2011 | Hui |
| 2002/0008605 | A1 | 1/2002 | Gardner |
| 2003/0095027 | A1 | 5/2003 | Shu Yuen Hui et al. |
| 2004/0056749 | A1 | 3/2004 | Kahlmann et al. |
| 2006/0263991 | A1 | 11/2006 | Lee et al. |
| 2007/0004194 | A1 | 1/2007 | Cho et al. |
| 2007/0122956 | A1 | 5/2007 | Chidambarrao et al. |
| 2007/0123031 | A1* | 5/2007 | Isogai .................... H01L 28/91 438/624 |
| 2007/0158859 | A1 | 7/2007 | Hierholzer |
| 2008/0079090 | A1 | 4/2008 | Hwang et al. |
| 2008/0157194 | A1 | 7/2008 | Lee et al. |
| 2008/0203455 | A1* | 8/2008 | Jang ................ H01L 27/10814 257/306 |
| 2008/0296667 | A1 | 12/2008 | Mikasa |
| 2009/0244866 | A1* | 10/2009 | Kawano ................. H01F 38/14 361/765 |
| 2010/0165048 | A1 | 7/2010 | DeBrabander et al. |
| 2011/0156854 | A1 | 6/2011 | Lee |
| 2011/0175193 | A1* | 7/2011 | Nakagawa ........ H01L 21/76801 257/531 |
| 2011/0241160 | A1* | 10/2011 | Kerber ................ H01L 23/5225 257/528 |
| 2014/0138351 | A1 | 5/2014 | Mancarella et al. |

OTHER PUBLICATIONS

Bodo's Power Systems, "Coreless Transformer Provides Innovative Features, The expansion of the EiceDRIVER-family," www.bodospower.com, Jan. 2007, 3 pages.

Tang, S.C., et al., "Coreless Printed Circuit Boad (PCB) Transformers with Multiple Secondary Windings for Complementary Gate Drive Circuits," IEEE Transactions on Power Electronics, vol. 14, No. 3, May 1999, pp. 431-437.

\* cited by examiner

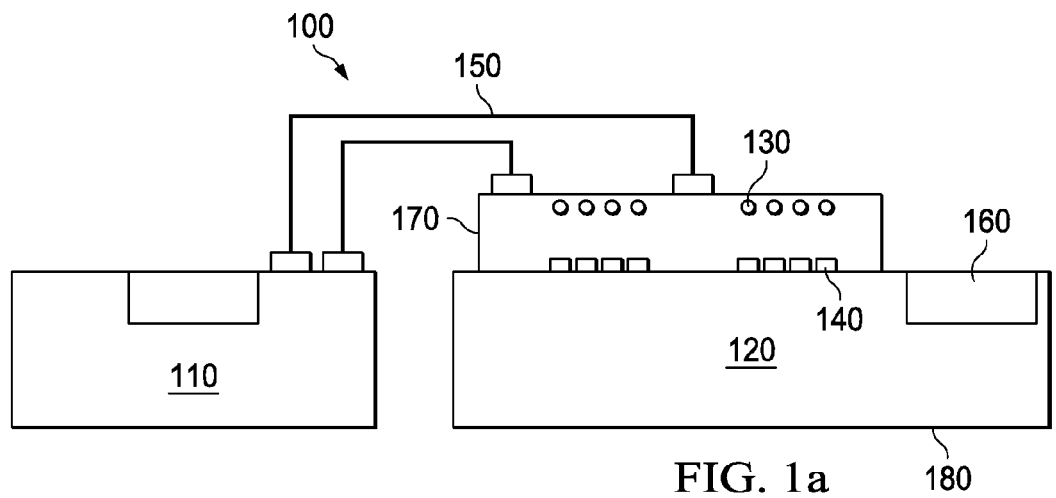
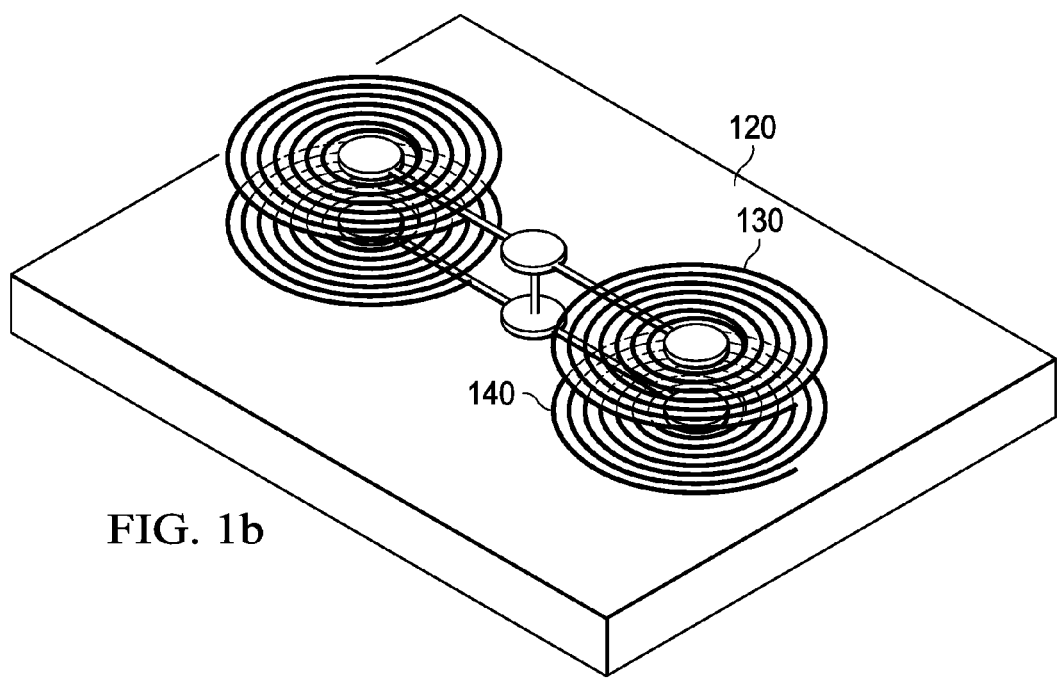

TRANSFORMER COMPRISING A ROUNDED COIL

The present application is a divisional application of U.S. application Ser. No. 13/452,669 filed on Apr. 20, 2012, which is incorporated herein by reference.

TECHNICAL FIELD

The present invention relates to a coil and a method of manufacturing a coil, and, in particular embodiments, to a transformer and a method of manufacturing a transformer.

BACKGROUND

Generally, discrete transformers and optocouplers are used to transmit signals from one electrical circuit to another electrical circuit without direct electrical contact between the two electrical circuits. However, discrete transformers and optocouplers are relatively large, heavy, and expensive, and in the case of optocouplers, aging may be a problem.

Another way to transmit signals from one electrical circuit to another electrical circuit without direct electrical contact is a coreless transformer. While a discrete transformer comprises a core to direct the magnetic flux, the coils of a coreless transformer can be placed close enough to each other so that the core can be spared.

SUMMARY OF THE INVENTION

In accordance with an embodiment of the present invention, a method for manufacturing an electronic device comprises forming an opening in an isolation layer, isotropically etching the opening thereby forming an extended opening with curved sidewalls, and forming a conductive material in the opening.

In accordance with an embodiment of the present invention, a method for manufacturing a semiconductor device comprises forming an opening in an isolation layer, the opening comprises sidewalls and a bottom surface, forming a second material layer along the sidewalls of the opening in the isolation layer and extending the opening in the isolation layer so that the extended opening lacks edges. The method further comprises removing the second material layer and filling the extended opening with a conductive material.

In accordance with an embodiment of the present invention, a method for manufacturing a semiconductor device comprises forming a first coil in a substrate, forming an isolation layer over the substrate comprising the first coil, and forming a second coil in the isolation layer substantially aligned with the first coil. Forming the second coil comprises forming an opening in the isolation layer, forming sidewall spacers along sidewalls of the opening in the isolation layer, isotropically etching the opening in the isolation layer thereby forming an extended opening, and depositing a conductive material in the extended opening.

In accordance with an embodiment of the present invention, a semiconductor device comprises an isolation layer disposed on a semiconductor substrate, and a first coil disposed in the isolation layer, wherein a cross sectional shape of the first coil is curved.

BRIEF DESCRIPTION OF THE DRAWINGS

For a more complete understanding of the present invention, and the advantages thereof, reference is now made to the following descriptions taken in conjunction with the accompanying drawings, in which:

FIG. 1a shows an embodiment of a coreless transformer;

FIG. 1b shows a three-dimensional view of two primary and two secondary coils;

DETAILED DESCRIPTION OF ILLUSTRATIVE EMBODIMENTS

Figure 2A:
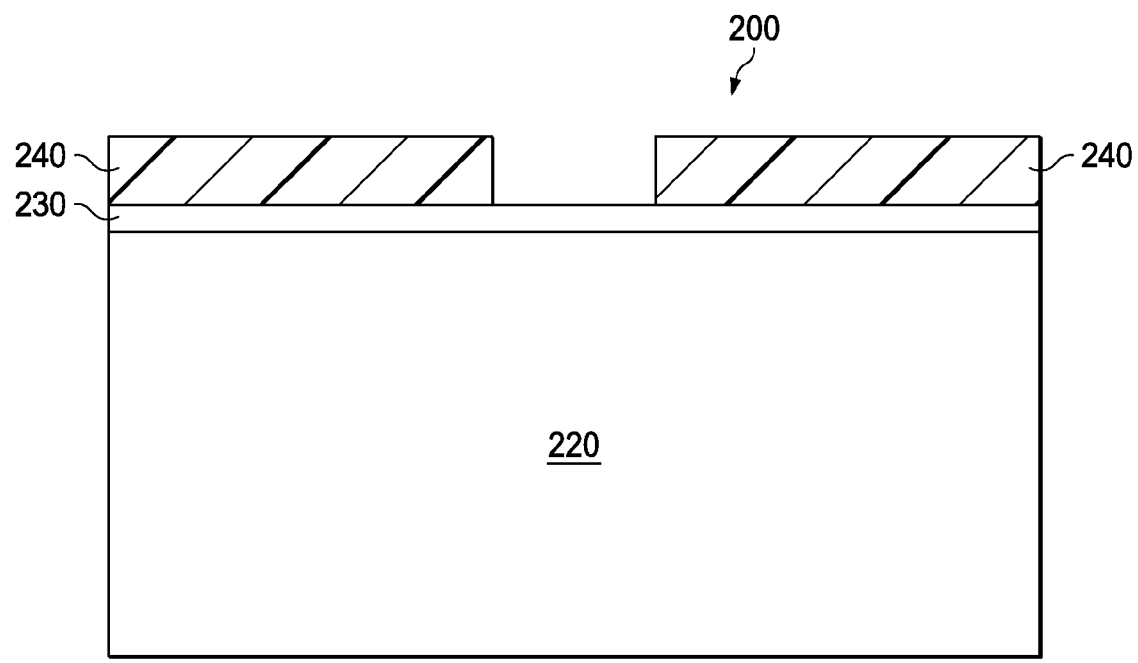
FIGS. 2a-2i illustrate cross-sectional views of a semiconductor device including a coil according to embodiments of the invention in various stages of fabrication.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a coil. The invention may also be applied, however, to a coreless transformer, to a discrete transformer or to a device comprising a coil.

Referring now to FIG. 1a, an embodiment of a coreless transformer 100 is shown. The coreless transformer comprises two semiconductor chips, a first semiconductor chip 110 and a second semiconductor chip 120. The first semiconductor chip 110 may comprise a transmitter, a receiver, a transceiver or any other kind of integrated circuit. The second semiconductor chip 120 may comprise a transmitter, a receiver, a transceiver or any other kind of integrated circuit. The second semiconductor chip 120 further comprises a primary coil 130 and a secondary coil 140. The first semiconductor chip 110 and the second semiconductor chip 120 are electrically connected, for example, via bond wires 150. Alternatively, the first semiconductor chip 110 and the second semiconductor chip 120 may be electrically connected via a bus system or via other electrical connections.

The first integrated circuit chip 110 may be electrically connected to the primary coil 130 and the integrated circuit 160 of the second integrated circuit chip 140 may be electrically connected to the secondary coil 140. In one embodiment the primary coil 130 and the secondary coil 140 are processed on wafer level.

The primary coil 130 is separated from the secondary coil 140 via an isolation layer 170. The secondary coil 140 is disposed in or on the semiconductor substrate 180 and the primary coil 130 is disposed in or on the isolation layer 170. If the primary coil 130 and the secondary coil 140 are disposed close enough, electrical signals can be transmitted between the primary coil 130 and the secondary coil 140 through electromagnetic coupling.

In one embodiment the coreless transformer 100 comprises three semiconductor chips, a first semiconductor chip comprising an integrated circuit and a second semiconductor chip comprising an integrated circuit. Each of the first and second integrated circuits may comprise a transmitter, a receiver, a transceiver or any other kind of integrated circuit. The third semiconductor chip comprises a primary coil and a secondary coil. The third semiconductor chip may be from material different than semiconductor materials. The first integrated circuit chip is electrically connected to the primary coil of the third semiconductor chip and the second semiconductor chip is electrically connected to the secondary coil of the third semiconductor chip.

FIG. 1b shows a three dimensional detailed view of a coil arrangement 100 comprising two primary and two secondary coils 130, 140 disposed in a substrate 120. Two coils 130, 140 may be used to transmit information or data in a differential mode to optimize the Common Mode Transient Immunity (CMTI). Alternatively, only one coil may be used but the CMTI robustness may not be so high. The coil arrangement 100 may be integrated with an IC as describe with respect to FIG. 1a or may be a stand along device wherein the primary coils 130 are electrically connected to a first stand-alone IC chip, and wherein the secondary coils 140 are electrically connected to a second stand-alone IC chip.

In a conventional transformer design a 14 µm PSG (Phosphoric Silicon Glass) isolation layer is disposed between the two coils. The primary coil is formed through a copper (Cu) damascene metallization process scheme. The secondary coil 140 is formed through an aluminum (Al) metal back end of line (BEOL) process scheme. A disadvantage of a coil design resulting from these processes is that the two coils are not able to withstand a voltage pulse of 11 kV, and a continuing charging up by 9 kV.

The problem with such a design is that Cu damascene metallization process scheme produces trenches with vertical sidewalls and a horizontal bottom surface which leads to sharp edges where the sidewalls and the bottom surface meet. Under operating conditions the coreless transformer may create excessive electrical field strength at the crossover of the sidewalls and the bottom surface. This excessive electrical field strength and not the regular field strength determine the dielectric strength of the transformer.

Moreover, copper and phosphoric silicon glass have substantially different thermal expansion coefficients. The substantially different thermal expansion coefficient may lead to mechanical stress which in turn may lead to cracks in the phosphoric silicon glass decreasing the lifetime expectancy and the reliability of the transformer.

In one embodiment the shape of a coil avoids or reduces excessive electrical field strength relative to a coil with edges or angles. In one embodiment a cross sectional shape of the coil is curved. A curved vertical cross sectional shape of the coil may be defined as free from angularity, as a continuously bending line without angles, as having no edges, or as being substantially round, substantially oval or substantially circular.

In one embodiment a method comprises forming sidewall spacers in an opening of an isolation layer and isotropically etching the bottom surface of the opening thereby forming an extended opening having a curved surface. In one embodiment a method comprises isotropically wet etching or isotropically dry etching an opening of an isolation layer thereby forming an extended opening having a curved surface.

In one embodiment the sidewall spacers in the opening are formed by depositing a material layer on sidewalls and the bottom surface of an opening and anisotropically removing the material layer overlying the bottom surface of the opening. In one embodiment the sidewall spacers in the opening are formed by depositing a photoresist layer on sidewalls and the bottom surface of an opening and exposing, developing and removing only the material layer overlying the bottom surface of the opening.

It is advantageous that excessive electrical field strength within the isolating layer can be reduced or avoided.

FIGS. 2a-2i illustrates cross-sectional views of a semiconductor device including a coil according to embodiments of the invention in various stages of fabrication.

A semiconductor device 200 includes an isolation layer 220, a first material layer 230 and a mask layer 240. The isolation layer 220 may be deposited on a semiconductor substrate (not shown). A secondary coil may be disposed in or on the semiconductor substrate.

The isolation layer 220 may be an oxide such as silicon oxide or phosphoric silicon glass (PSG). Alternatively, the isolation layer 220 may be a low-k-material such as fluorinated oxides, or a combination of the low-k material with silicon oxide. In one embodiment the low-k material is not porous low-k-material. The isolation layer 220 may be between about 1 µm and about 100 µm thick. In one specific example, the isolation layer 220 may be between about 10 µm to about 20 µm thick or 14 µm thick. The isolation layer 220 may be formed using a chemical vapor deposition (CVD) process, e.g., a plasma enhanced CVD process.

A first material layer 230 is disposed over the isolation layer 220. In one embodiment the first material layer 230 has the following individual or combined properties or characteristics: The material of the first material layer 230 has a lower etching rate (e.g., in HF based wet etching) for a particular etching chemistry than the material of the isolation layer 220. The material of the first material layer 230 is selective to the material of the isolation layer 220. The first material layer 230 is mechanically stable so that in a cleaning process spacers formed in the material layer 230 do not break or do not cling together.

In one embodiment, the first material layer 230 comprises polycrystalline silicon. Polycrystalline silicon withstands an application of a HF based etching chemistry and can be highly selectively removed relative to the material of the isolation layer 220. Alternatively, the first material layer 230 may comprise a nitride such as a silicon nitride. For example, the silicon nitride is formed in a low pressure chemical vapor deposition (LPCVD). The etching rate of LPCVD silicon nitride is 500 times lower than the etching rate of plasma enhanced PECVD deposited PSG material of the isolation layer 220. Moreover, LPCVD silicon nitride can be removed with hot (e.g., temperature range ~150° C.) phosphoric acid (e.g., $H_3PO_4$ (80%)) or plasma etching while the material of the isolation layer 220 may not be attacked with these etching processes.

In a further embodiment, the first material layer 230 comprises an oxide such as a silicon oxide. The silicon oxide may be a thermal oxide.

In a further embodiment, the first material layer 230 may comprise a metal such as titanium tungsten (TiW). Metals may not be etched in a HF based etching chemistry but may be selectively removed by applying ammonia/hydrogen peroxide (e.g., $NH_4OH/H_2O_2$).

In a final embodiment, the first material layer 230 may comprise carbon, a resist or an imide. Carbon or a resist are resistant against an application of an HF based etching chemistry while they can be selectively removed with $O_2$ plasma.

The first material layer 230 may be between about 100 nm and about 1000 nm thick. In a particular example, the first material layer 230 is between about 100 nm to about 400 nm thick.

The mask layer 240 may be a hard mask or a photoresist. For example, the hard mask may be an oxide such as a silicon oxide or a nitride such as silicon nitride. Alternatively, the photoresist may be an imide. The mask layer 240 is patterned and an opening is formed.

Figure 2B:
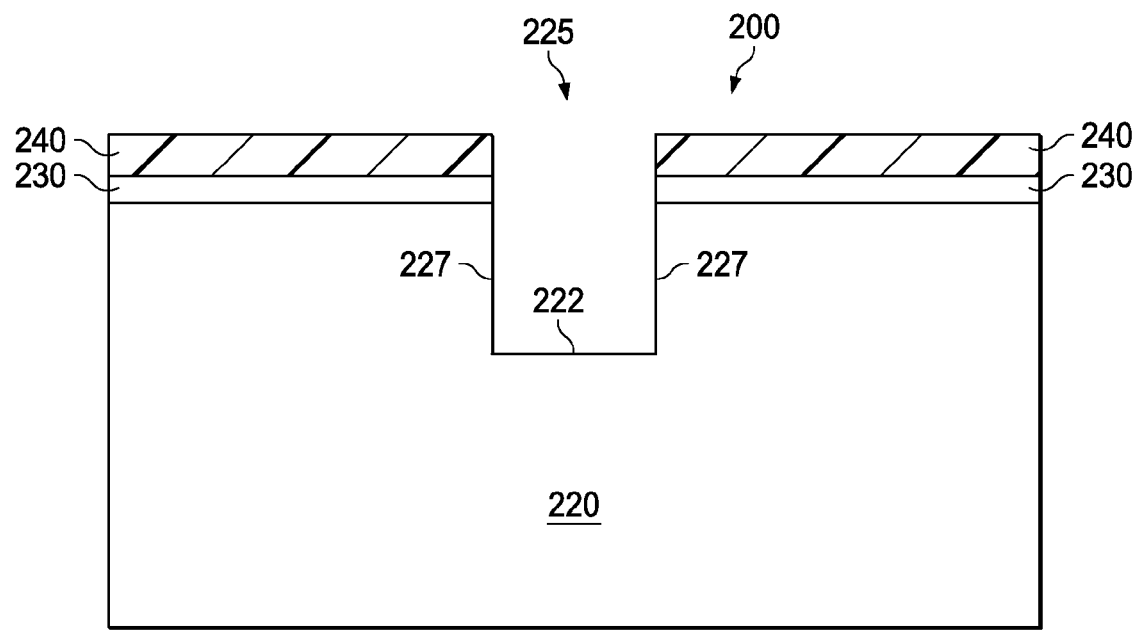

In FIG. 2b, the first material layer 230 and the isolation layer 220 are anisotropically etched through the patterned mask layer 240 and an opening 225 is formed into the isolation layer 220. The anisotropical etch may be a plasma etch process based on fluorine chemistry. The etching chemistry may be $CF_4/CHF_3$ and Ar or $SF_6/Ar$. The opening 225 comprises sidewalls 227 and a bottom surface 222. The opening 225 may comprise a trench. The opening may be about 0.2 µm to about 3 µm deep, or alternatively, about 1 µm deep.

After forming the opening 225, the mask layer 240 is removed. The mask layer 240 can be removed by an $O_2$ plasma or liquid photoresist stripper.

Figure 2C:
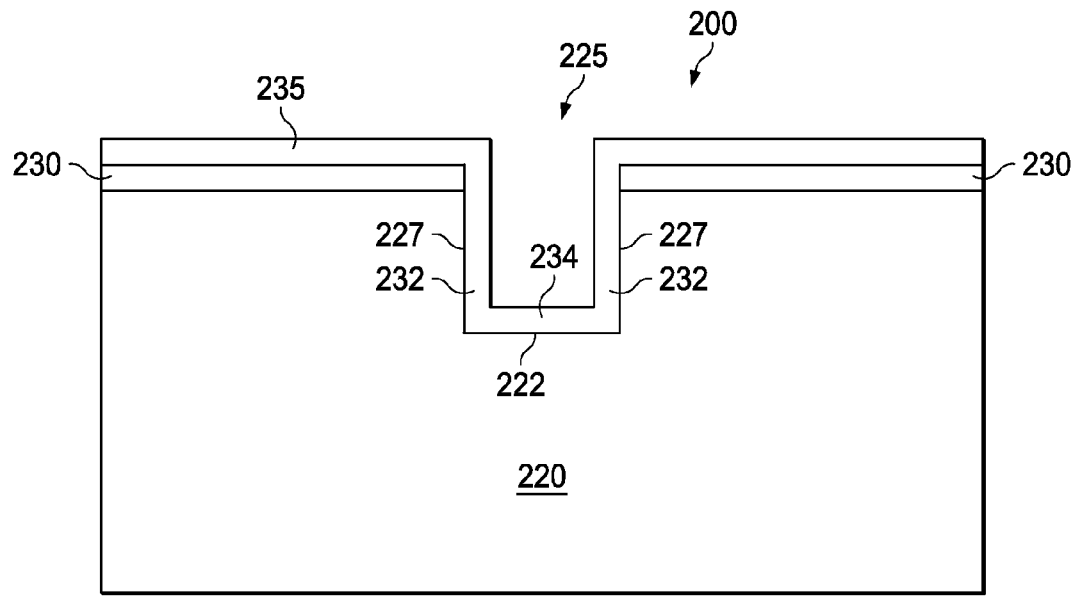

In FIG. 2c, an optional second material layer 235 is formed along the sidewalls 227 and the bottom surface 222 of the opening 225, and over the top surface of the semiconductor device 200. The optional second material layer 235 may be the same as the first material layer 230 or may be different. In one embodiment, the optional second material layer 235 comprises the same properties, characteristics and materials as described for the first material layer 230. The optional second material layer 235 may be between about 50 nm and about 1000 nm thick. In a particular example, the optional second material layer 235 is between about 100 nm to about 400 nm thick.

The deposition of the optional second material layer 235 may form the spacers 232 along the sidewalls 227 of the opening 225 and a bottom coverage 234 overlying the bottom surface 222 of the opening 225.

Figure 2D:
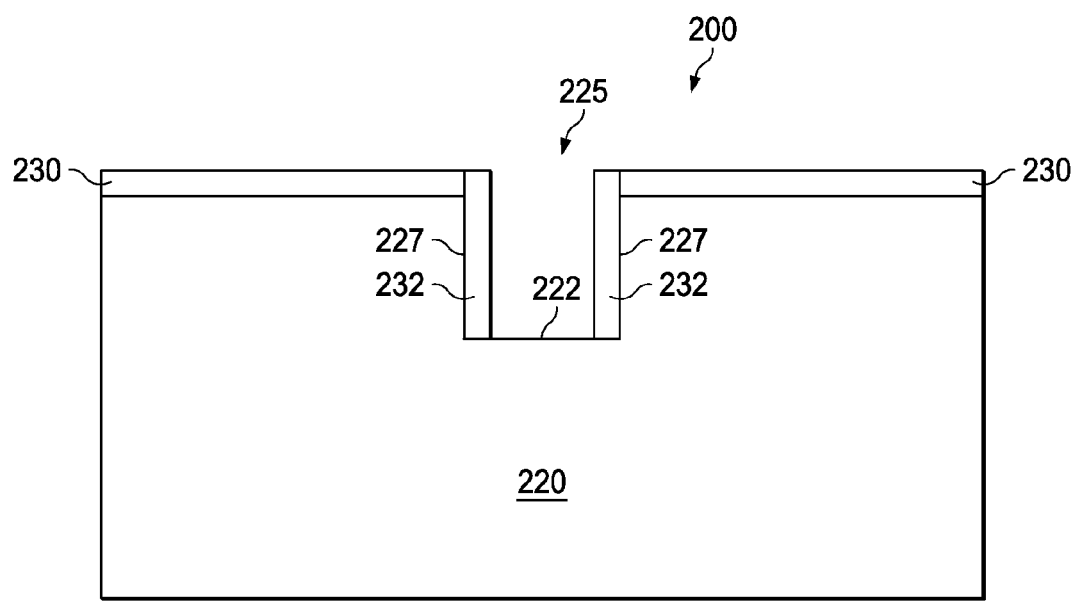

As shown in FIG. 2d, an anisotropical etch is performed removing the bottom coverage 234 of the optional second material layer 235. The anisotropical etch may be a dry etch such as fluorine etching chemistry (e.g., $CF_4/CHF_3$ and Ar or $SF_6/Ar$). The removal of the bottom coverage 234 exposes the bottom surface 222 of the opening 225 creating a point where a subsequent etch can be applied. The sidewall spacers 232 may not or may only barely be etched and remain intact. The sidewall spacers 232 may cover the entire depth of the sidewalls 227 or only a portion of the depth of the sidewalls 227. The trench depth to sidewall spacer depth can be 7/10, for example, but many different ratios up to a 1/10 ratio are possible. The ratios may be achieved by extending the opening 225 further into the isolation layer 220.

Figure 2E:
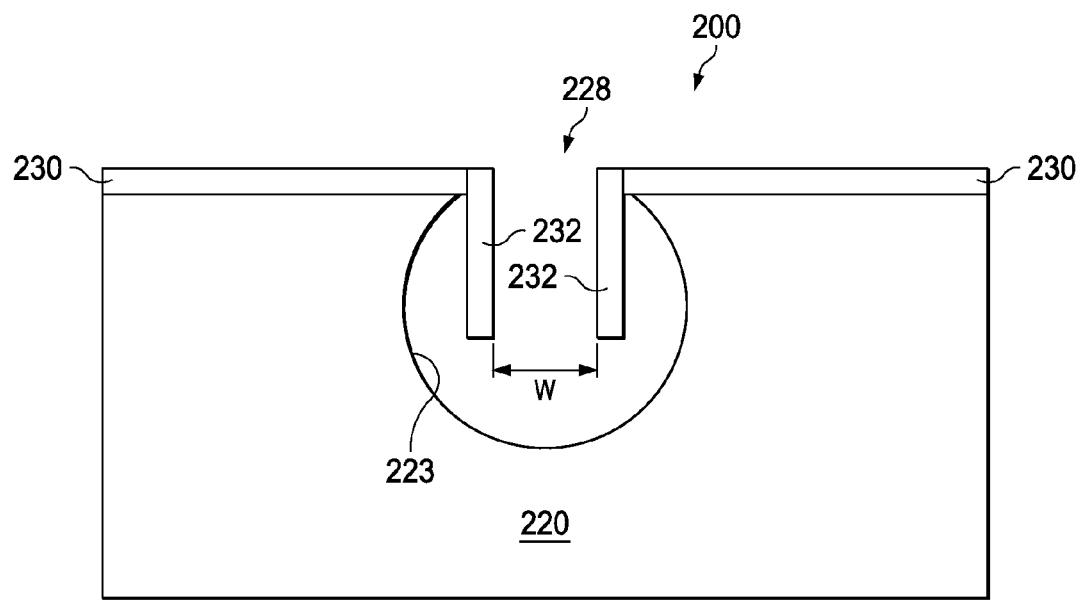
Figure 2F:
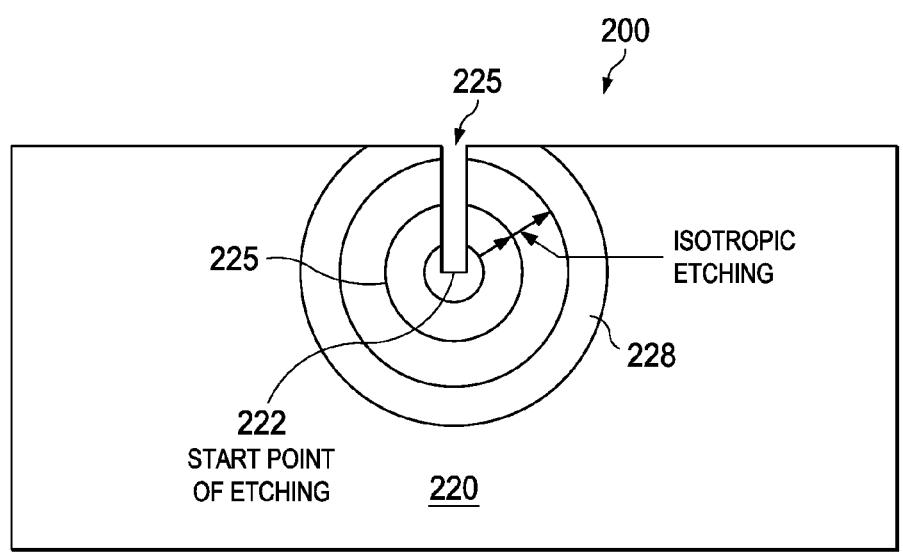
Figure 4A:
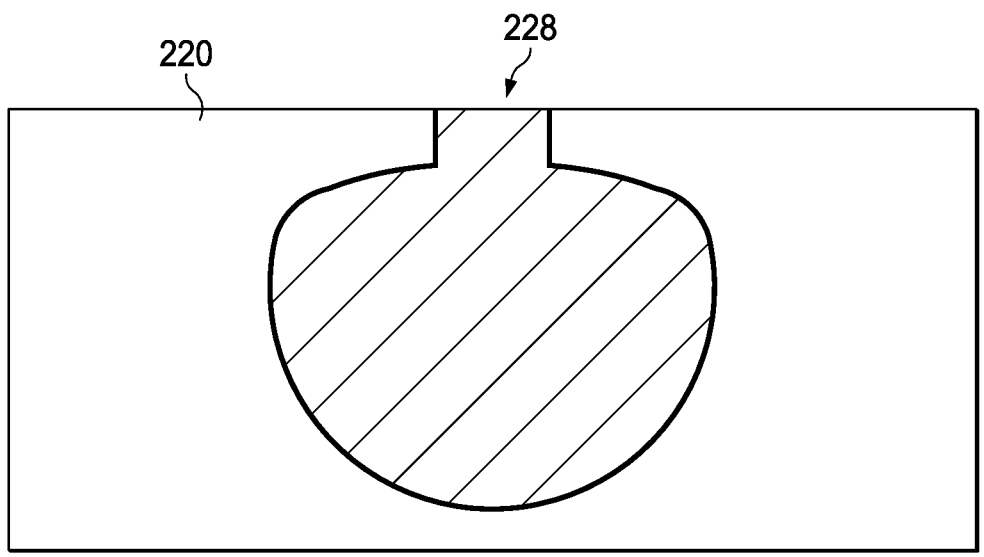
FIG. 4a shows an extended opening after performing an isotropic etch with sidewall spacers.

Next, as shown in FIG. 2e, an isotropic etch is applied to the opening 225 of the semiconductor device 200. The isotropic etch may be applied to the bottom surface 222 of the opening 225. The removal of the isolation layer 220 material starts at the exposed bottom surface 222 of the opening 225 and extends the opening 225 forming an extended opening 228. Alternatively, the removal of the isolation layer 220 material starts at the exposed sidewalls 227 and the bottom surface 222 of the opening 225. FIG. 2f shows how the application of the isotropic etch chemistry etches through the isolating material of the isolation layer 220. Because the isotropic etch is selective to the first material layer 230 and the remains of the second material layer 235 (including the sidewall spacers), the etch removes isolation layer 220 material but not or only barely the material of the first material layer 230 and/or the second material layers 235. FIG. 4a shows an extended opening 228 after performing the isotropic etch with sidewall spacers 232.

Figure 4B:
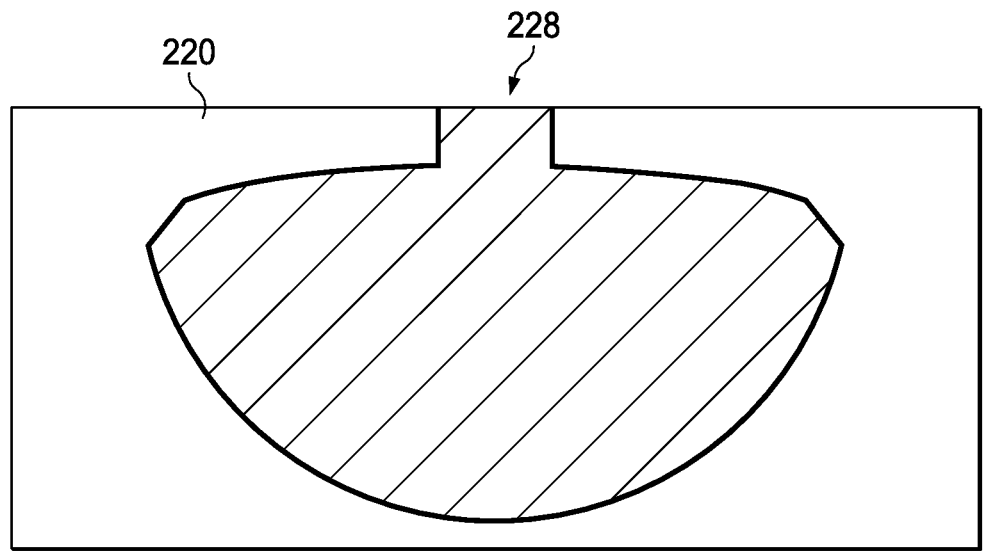
FIG. 4b shows an extended opening after performing an isotropic etch without sidewall spacers.

Alternatively, if the optional second material layer 235 is not deposited, the removal of the isolation layer 220 material starts at the sidewalls 227 and the bottom surface 222 of the opening 225. FIG. 4b shows the extended opening 228 after performing the isotropic etch without sidewall spacers.

FIGS. 4a and 4b show an extended opening 228 with curved sidewalls along a vertical cross section (360 degree) extended opening. The radius of curvature for the extended opening 228 may be substantially the same (as shown in FIG. 4a) or may be different (as shown in FIG. 4b). In one embodiment of FIG. 4a, the radius of curvature is substantially the same for at least about 90 degrees or at least about 180 degrees of the (360 degree) cross sectional view of the opening 228. Alternatively, the radius of curvature is substantially the same for at least about 240 degrees of the cross section. Still alternatively, the radius of curvature is substantially the same for at least about 45 degrees or at least about 90 degrees in a lower left region and/or in a lower right region. The radius of curvature in the lower left region may be substantially the same than the radius of curvature in the lower right region.

The radius of curvature in the upper region may remain substantially the same for at least about 45 degrees in the upper left region and/or in the upper right region. The radius of curvature in an upper region may be the same or may be different than the radius of curvature in the lower region. In the region between the lower region and the upper region the radius of curvature may slowly change.

The radius of curvature for the extended opening 228 shown in FIG. 4b may remain substantially the same for portions of the lower region. For example, the radius of curvature remains substantially the same for a lower left region and/or a lower right region. The radius of curvature remains substantially the same for at least up to about 45 or at least up to about 90 degrees for the lower left region and the lower right region, respectively. The lower left region and the lower right region may be separated by a lower intermediate region, e.g., a substantially flat region. The lower intermediate region may have a different radius of curvature than the radii of the other two lower portions.

The radius of curvature may be different for the upper region than the radii in the lower regions. The radius of curvature may change abruptly one or several times in the upper region. The radius of curvature may not remain substantially the same over large portions of the upper region. For example, the radius of curvature may not remain substantially the same for or up to about 90 degrees.

The isotropic etch forms an extended opening 228 with a curved shape in a cross sectional view. The curved cross sectional shape of the extended opening 228 may be defined as free from angularity, as a continuously bending line without angles, as having no edges, or as being substantially round, substantially elliptical, substantially oval or substantially circular.

In some embodiment the curved shape of the extended opening 228 is substantially homogenous curved or comprises substantially homogeneous curved sidewalls over the entire cross section, as shown in FIG. 4a, for example. The extended opening 228 has substantially the same rounding radius at a top portion of the extended opening 228 and at a bottom portion of the extended opening 228. In other embodiments the curved shape of the extended opening 228 is different in different portions of the cross section or the curved sidewalls. For example, as shown in FIG. 4b, the rounding radius or the curved sidewall shape in a top portion of the extended opening 228 is different than the rounding radius or the curved sidewall shape in a bottom portion of the extended opening 228.

In one embodiment the isotropic etch removes the isolation material in a substantially circular or substantially oval fashion around the starting point or the starting area, e.g., the bottom surface 220, so that an extended opening 228 with a curved cross sectional view is formed in the isolation material. The surface 223 of the extended opening 228 may be smooth without any edges. The width w of the opening where the isotropic etch may start is defined or adjusted by the width of the opening 225 and the width of the sidewall spacers 232. For example, in one embodiment the width of the opening is 900 nm, and the width of the two sidewall spacers is each 300 nm so that the width w where the isotropic etch may start is 300 nm. A rule of thumb for forming the extended opening via the isotropic etch may be: the smaller the width w of the bottom surface of the opening the more circular the extended opening 228. Varying the width w varies the shape of the extended opening 228 in a cross sectional view.

The dimensions of the depth of the opening 225 and the width w of the opening 225 depend on the desired dimensions of the extended opening 228, e.g., the coil dimensions. An extended opening 228 formed by such an isotropic etch process and filled with a conductive material avoids or reduces excessive electrical field strength under operation.

FIG. 2f also shows that the longer the isotropic etch is applied the larger the diameter of the extended opening 228. In case there is no direct endpoint detection method available for the isotropic etch, a strict control of the etch rate influencing process parameters (temperature, etch chemistry concentration, isolation material properties) may be used.

The isotropic etch may comprise a wet etch. In one embodiment the wet etch comprises a HF (hydrogen fluoride) etching chemistry or a mixture thereof (e.g., $NH_4F$:HF with a typical ratio of 30:6). Various etching rates can be achieved by varying the HF concentration and/or the temperature of the etching mixture. HF etch rates on an oxide may be dependent on the properties and characteristics of the oxide. For example, a boron doped silicon oxide may etch slower than an undoped silicon oxide, while phosphorus or other 5-valant doped silicon oxide may etch faster than an undoped silicon oxide. Oxide density may also affect the etch rate. A dense oxide may etch slower than a not so dense oxide. Alternatively, the isotropic etch may comprise an isotropic dry etch (e.g., $NF_3$ or $SF_6$).

After the isotropic etch is carried out the sidewall spacers 232 may remain intact. The sidewall spacers 232 may not be etched by the isotropic etch. The sidewall spacers 232 may remain free standing extending in the extended opening 228 since the sidewalls 227 of the original trench 225 have been removed by the isotropic etch.

After the isotropic etch the semiconductor device 200 may be cleaned and/or dried. In one embodiment the sidewall spacers 232 have enough mechanical strength to withstand bending or breaking during cleaning and drying. Alternatively, if the sidewall spacers 232 do not have enough mechanical strength, supercritical drying can be used.

Figure 2G:
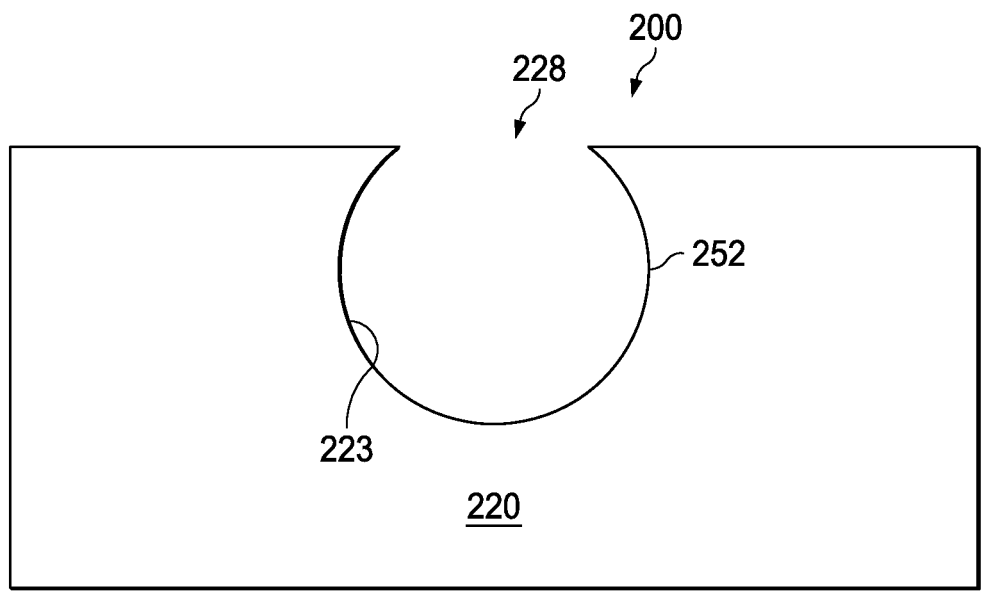

As can be seen from FIG. 2g, the first material layer 230 and the remains of the optional second material layer 235 (e.g., sidewall spacers 232) are removed from top surface of the isolation layer 220 and in the extended opening 228. The first and the optional second material layers 230, 235 may be removed in one etching step if they are from the same material or in two etching steps if they are from different materials. To remove the layers a hot phosphor acid (e.g., $H_3PO_4$) may be applied.

Figure 2H:
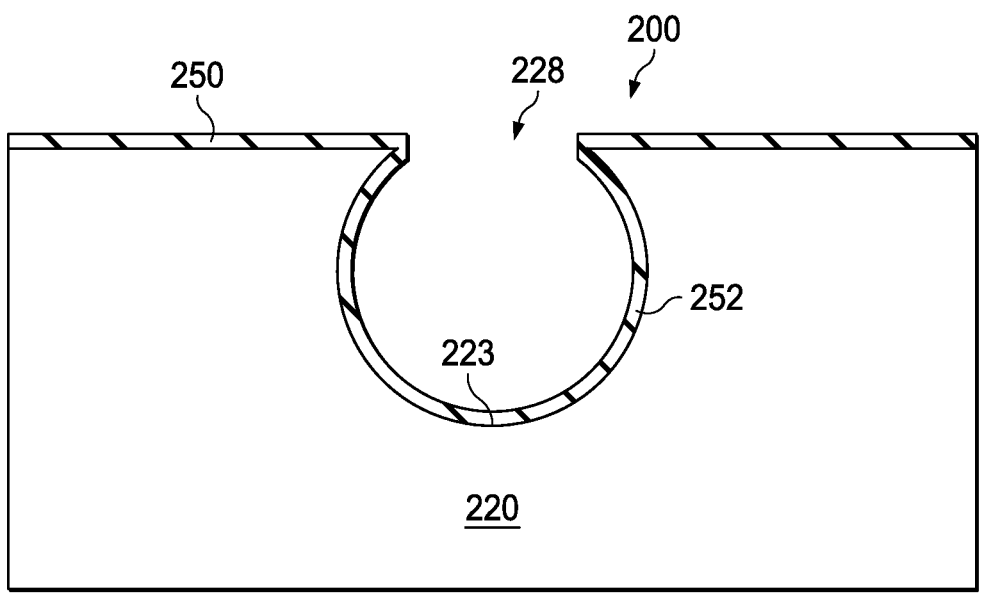

In FIG. 2h, a barrier layer 250 is formed on the top surface of the isolation layer 220 and on the surface 223 of the extended opening 228. The barrier layer 250 may comprise tantalum (Ta), tantalum nitride (TaN), titanium tungsten (TiW), or combinations thereof. The barrier layer 250 may be one layer or a plurality of layers. For example, the barrier layer may be a tantalum nitride (TaN)/tantalum (Ta) bi-layer. The barrier layer 250 may be between about 5 nm and about 100 nm thick. In a bi-layer arrangement each layer may be between about 5 nm and about 100 nm thick. The barrier layer 252 in the extended opening 228 may be of uniform thickness or may be thicker in a lower part of the extended opening 228 and thinner in an upper part of the extended opening 228. Generally, there should be at least a barrier layer 250 of about 5 nm thickness in the upper part of the opening.

The barrier layer 250 may be formed applying bias sputtering. Alternatively, the barrier layer 250 may be formed using a CVD process.

Figure 2I:
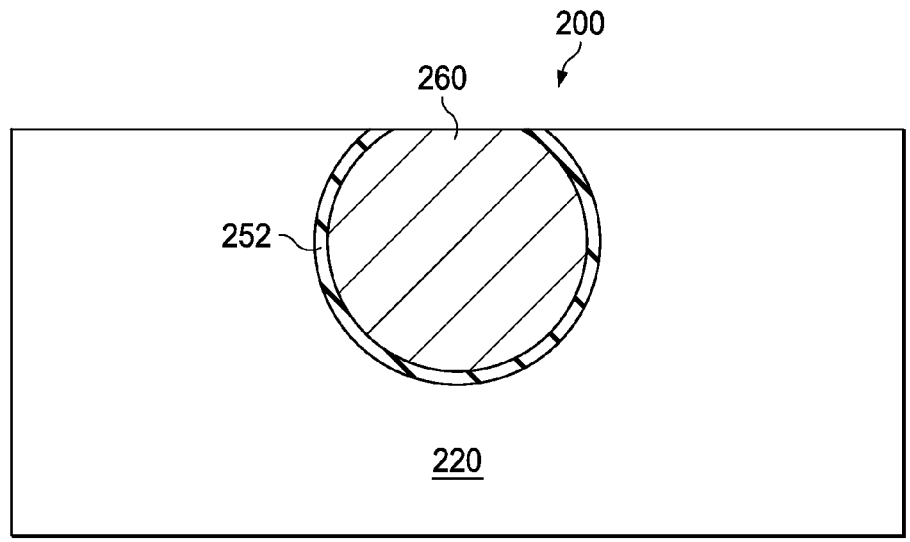

In FIG. 2i, the extended opening 228 may be filled with a conductive material 260. The conductive material 260 may be copper (Cu), copper alloys or aluminum (Al) or combinations thereof.

In one embodiment a conductive seed layer is formed or sputtered onto the barrier layer 250. The seed layer may cover the upper surface of the barrier layer 250 including the surface of the barrier layer 252 in the upper part of the extended opening 228. The extended opening 228 is then completely filled with the conductive material. The extended opening 228 may be filled through an electro-plating process or an electroless-plating process. In one embodiment a copper (Cu) seed layer is first formed in the extended opening 228 and the extended opening is then filled with a Cu electro-plating process.

In one embodiment the extended opening 228 is filled with a conductive material using a CVD process.

Conductive material formed outside of the extended opening 228 may be removed applying a chemical mechanical polishing (CMP) process, and a coil is formed in the isolation layer 220.

FIGS. 2a-2i only show the formation of a single coil winding in the isolation layer 220. However, the disclosed process covers also the formation of all windings in a coil as well as a plurality of coils in an isolation layer on a wafer, for example.

FIGS. 3a-3j illustrate cross-sectional views of a semiconductor device including a coil according to embodiments of the invention in various stages of fabrication.

A semiconductor device 300 includes an isolation layer 320 and a first mask layer 340. The isolation layer 320 may be deposited on a semiconductor substrate (not shown). A secondary coil may be disposed in or on the semiconductor substrate.

The isolation layer 320 may be an oxide such as silicon oxide or phosphoric silicon glass (PSG). Alternatively, the isolation layer 320 may be a low-k-material such as fluorinated oxides, or a combination of the low-k material with silicon oxide. In one embodiment the low-k material is not porous low-k-material. The isolation layer 320 may be between about 1 μm and about 100 μm thick. In one specific example, the isolation layer 320 may be between about 10 μm to about 20 μm thick or alternatively 14 μm thick. The isolation layer 320 may be formed using a chemical vapor deposition (CVD) process, e.g., a plasma enhanced CVD process.

The first mask layer 340 may be a photoresist. For example, the first mask layer may be an imide. The first mask layer 340 is patterned and an opening 345 is formed (FIG. 3a).

Figure 3A:
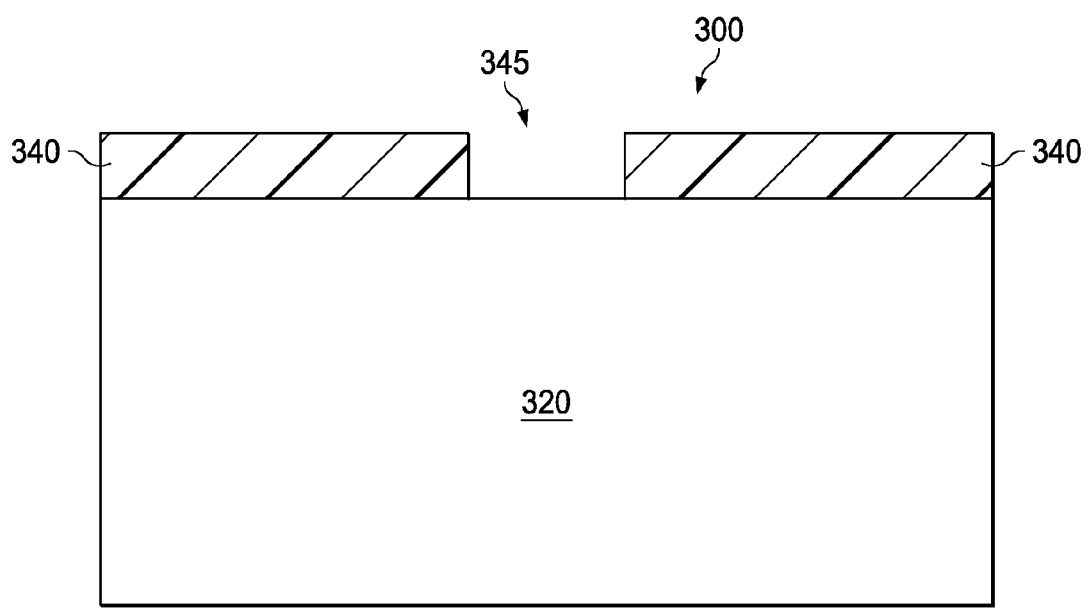
FIGS. 3a-3j illustrate cross-sectional views of a semiconductor device including a coil according to embodiments of the invention in various stages of fabrication.
Figure 3B:
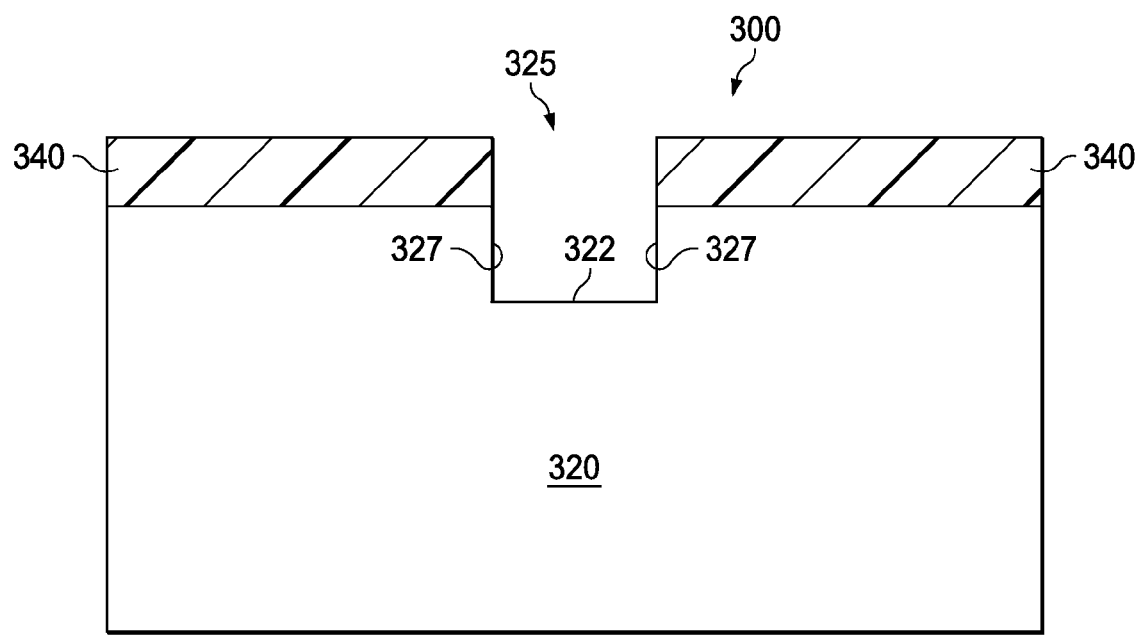

As shown in FIGS. 3a and 3b, the isolation layer 320 is anisotropically etched through the patterned first mask layer 340 and an opening 325 is formed into the isolation layer 320. The anisotropical etch may be a RIE such as plasma etch process based on fluorine chemistry. The etching chemistry may be $CF_4/CHF_3$ and Ar or $SF_6/Ar$. The opening 325 comprises sidewalls 327 and a bottom surface 322. The opening 325 may comprise a trench. The opening 325 may be about 0.2 μm to about 3 μm deep, or alternatively, about 1 μm deep.

Figure 3C:
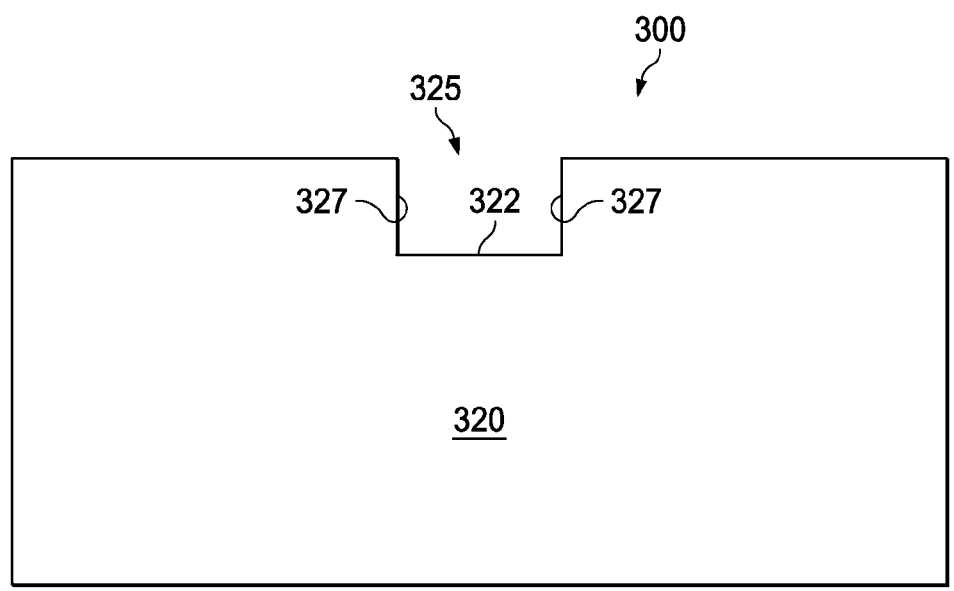

After forming the opening 325, the first mask layer 340 is removed or stripped. The first mask layer 340 can be removed by an $O_2$ plasma or liquid photoresist stripper. This is shown in FIG. 3c.

Figure 3D:
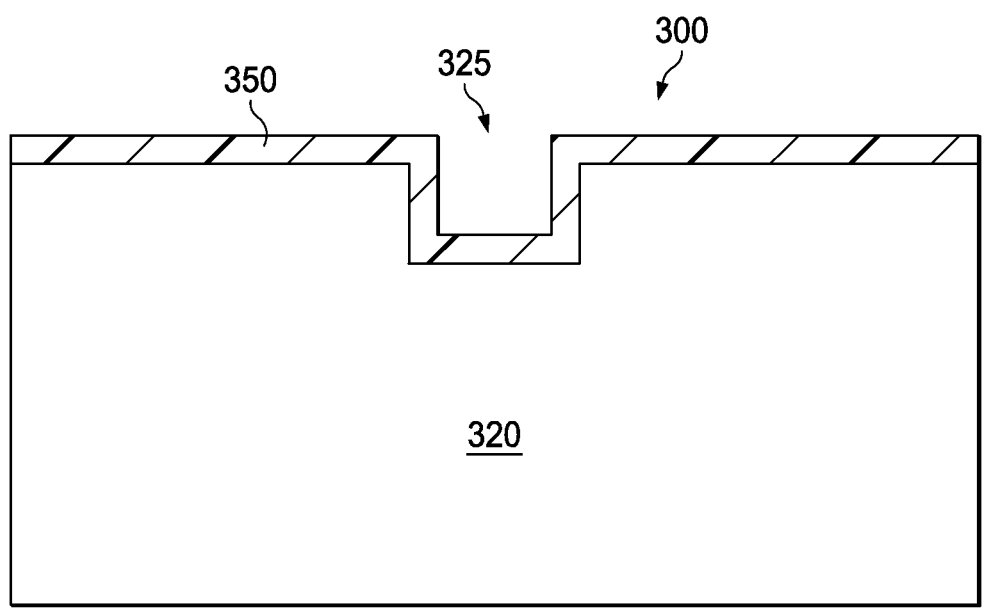

In FIG. 3d, a second mask layer 350 is formed over the top surface of the isolation layer 320, along the sidewalls 327 of the opening 325 and over the bottom surface 322 of the opening 325. The second mask layer 350 may be conformal disposed over the exposed surfaces of the isolation layer 320 and the opening 325. The second mask layer 350 may comprise a photoresist such as a positive photoresist. A positive photoresist is a type of photoresist in which the portion of the photoresist that is exposed to light becomes soluble to the photoresist developer. The portion of the photoresist that is unexposed remains insoluble to the photoresist developer. The second mask layer 350 may be an imide. The second mask layer 350 may comprise the same material or may comprise different materials than the first mask layer 340.

Figure 3E:
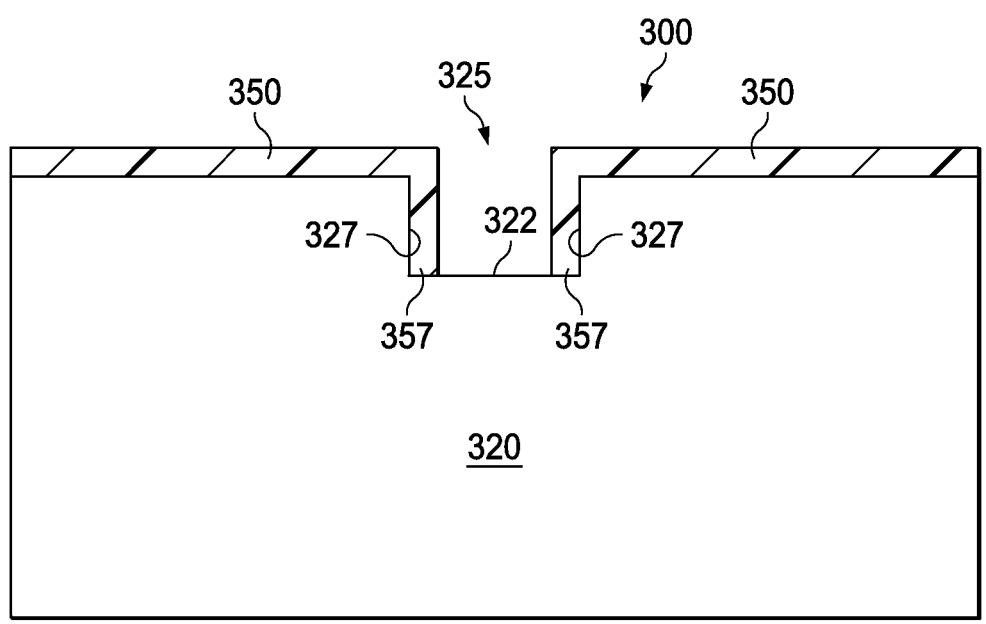

The second mask layer 350 is exposed to light and made soluble along the bottom surface 322 of the opening 325. In one embodiment the second mask layer 350 is exposed to light and made not soluble along the sidewalls 327 and/or the top surface of the isolation layer 320. The second mask layer 350 is exposed such that the exposure light is focused on the bottom surface 322 of the opening 325. Conversely, the second mask layer 350 is exposed such that the exposure light is not focused or defocused on the sidewalls 327 of the opening 325 and the top surface of the isolation layer 320. The second mask layer 350 is developed and removed, and since only the second mask layer 350 material along bottom surface 322 of the opening 325 is soluble this portion of the second mask layer 350 is removed exposing the bottom surface 322 of the opening 325 and forming sidewall spacers 357. This is shown in FIG. 3e. The sidewall spacers 357 may cover the entire depth of the sidewalls 327 or only a portion of the depth of the sidewalls 327. The trench depth to sidewall spacer depth can be 7/10, for example, but many different ratios up to a 1/10 ratio are possible. The ratios may be achieved by extending the opening 325 further into the isolation layer 320.

Figure 3F:
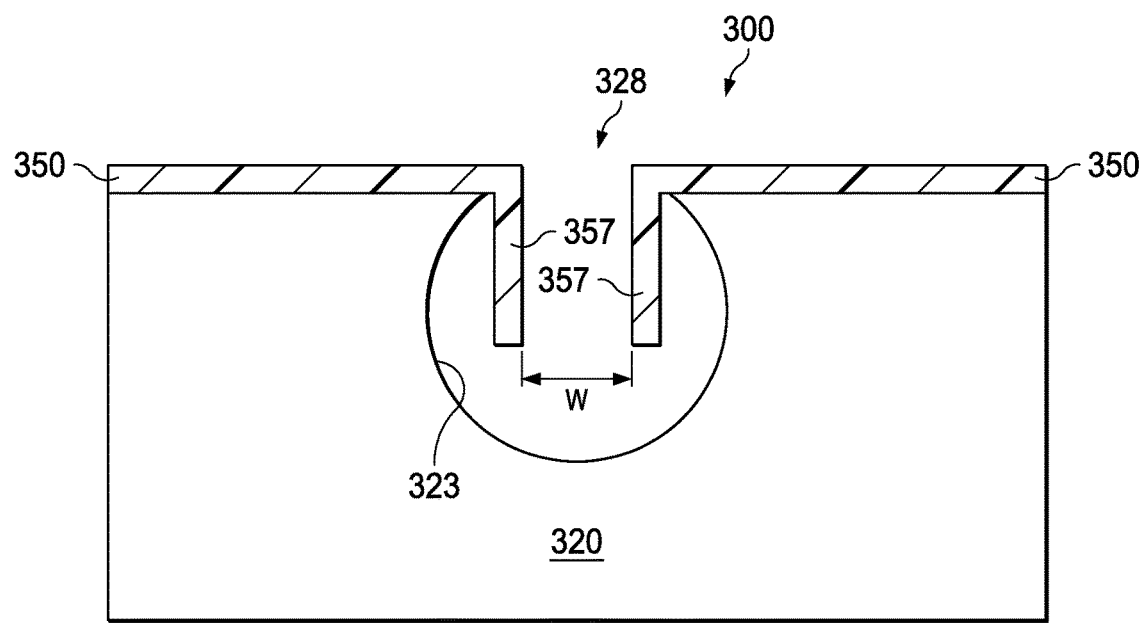

Next, an isotropic etch is applied to the opening 325 of the semiconductor device 300. The isotropic etch may be applied to the bottom surface 322 of the opening 325. The removal of the isolation layer 320 material starts at the exposed bottom surface 322 of the opening 325 and extends the opening 325 forming an extended opening 328. The extended opening 328 comprises a surface 323. This is shown in FIG. 3f. Alternatively, the removal of the isolation layer 320 material starts at the exposed sidewalls 327 and the bottom surface 322 of the opening 325. The isotropic etch removes isolation layer 320 material in the same or similar fashion as described with regard to FIG. 2f. Because the isotropic etch is selective to the second mask layer 350, including the sidewall spacers 357, the etch removes isolation layer 320 material but not or only barely the material of the second mask layer 350. FIG. 4a shows an extended opening 328 after performing the isotropic etch with sidewall spacers 352.

Alternatively, if the depth of the sidewall spacers of the second mask layer 350 is short relative to the depth of the opening 325, the removal of the isolation layer 320 material starts at the sidewalls 327 and the bottom surface 322 of the opening 325. FIG. 4b shows the extended opening 328 after performing the isotropic etch without or with short sidewall spacers 357.

The dimensions of the depth of the opening 325 and the width w of the opening 325 depend on the desired dimensions of the extended opening 328, e.g., the coil dimensions. An extended opening 328 formed by such an isotropic etch process and filled with a conductive material avoids or reduces excessive electrical field strength under operation.

The isotropic etch may comprise a wet etch. In one embodiment the wet etch comprises a HF (hydrogen fluoride) etching chemistry or a mixture thereof (e.g., $NH_4F$:HF with a typical ratio of 30:6). Various etching rates can be achieved by varying the HF concentration and/or the temperature of the etching mixture. HF etch rates on an oxide may be dependent on the properties and characteristics of the oxide. For example, a boron doped silicon oxide may etch slower than an undoped silicon oxide, while phosphorus or other 5-valant doped silicon oxide may etch faster than an undoped silicon oxide. Oxide density may also affect the etch rate. A dense oxide may etch slower than a not so dense oxide. Alternatively, the isotropic etch may comprise an isotropic dry etch (e.g., $NF_3$ or $SF_6$).

After the isotropic etch is carried out the sidewall spacers 357 may remain intact. The sidewall spacers 357 may not be etched by the isotropic etch. The sidewall spacers 357 may remain free standing extending in the extended opening 328 since the sidewalls 327 of the original trench 325 have been removed by the isotropic etch.

After the isotropic etch the semiconductor device 300 may be cleaned and/or dried. In one embodiment the sidewall spacers 332 have enough mechanical strength to withstand bending or breaking during cleaning and drying. Alternatively, if the sidewall spacers 332 do not have enough mechanical strength, supercritical drying can be used.

Figure 3G:
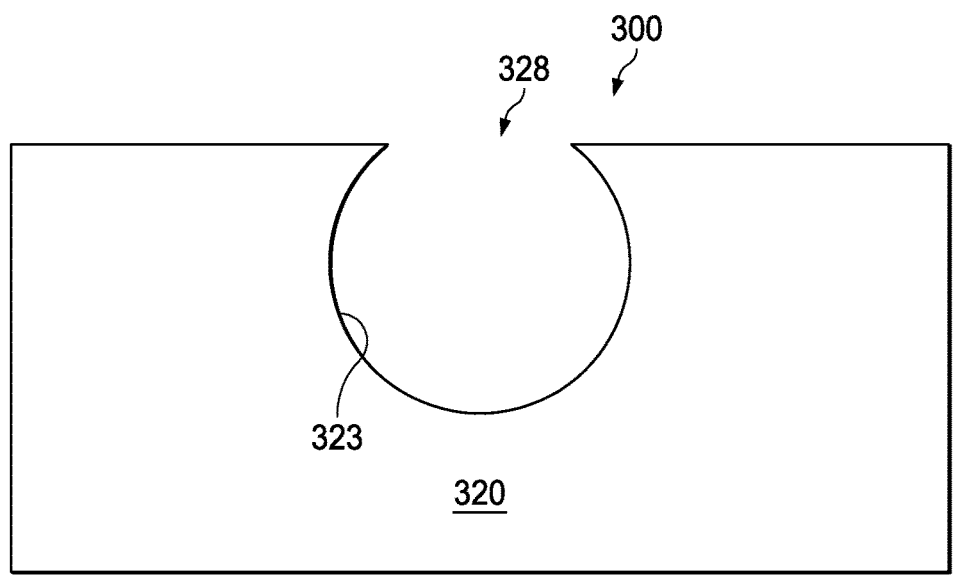

As can be seen from FIG. 3g, the second mask layer 350, including the sidewall spacers 357, is removed from top surface of the isolation layer 320 and in the extended opening 328. The second mask layer 350 can be removed by an $O_2$ plasma or liquid photoresist stripper.

Figure 3H:
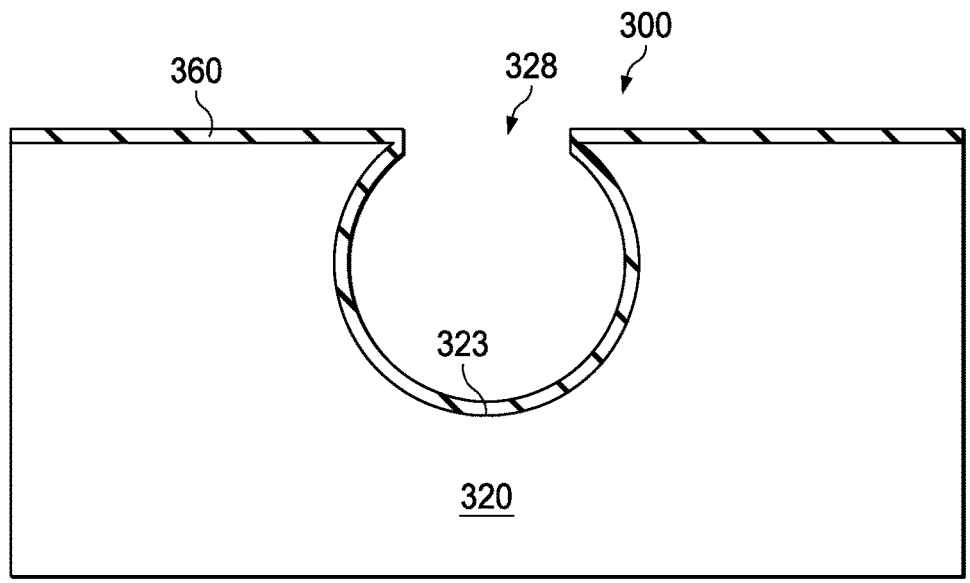

In FIG. 3h, a barrier layer 360 is formed on the top surface of the isolation layer 320 and on the surface 323 of the extended opening 328. The barrier layer 360 may comprise tantalum (Ta), tantalum nitride (TaN), titanium tungsten (TiW), or combinations thereof. The barrier layer 360 may be one layer or a plurality of layers. For example, the barrier layer 360 may be a tantalum nitride (TaN)/tantalum (Ta) bi-layer. The barrier layer 360 may be between about 5 nm and about 100 nm thick. In a bi-layer arrangement each layer may be between about 5 nm and about 100 nm thick. The barrier layer 360 in the extended opening 328 may be of uniform thickness or may be thicker in a lower part of the extended opening 360 and thinner in an upper part of the extended opening 328. Generally, there should be at least a barrier layer 360 of about 5 nm thickness in the upper part of the opening.

The barrier layer 360 may be formed applying bias sputtering. Alternatively, the barrier layer 360 may be formed using a CVD process.

Figure 3I:
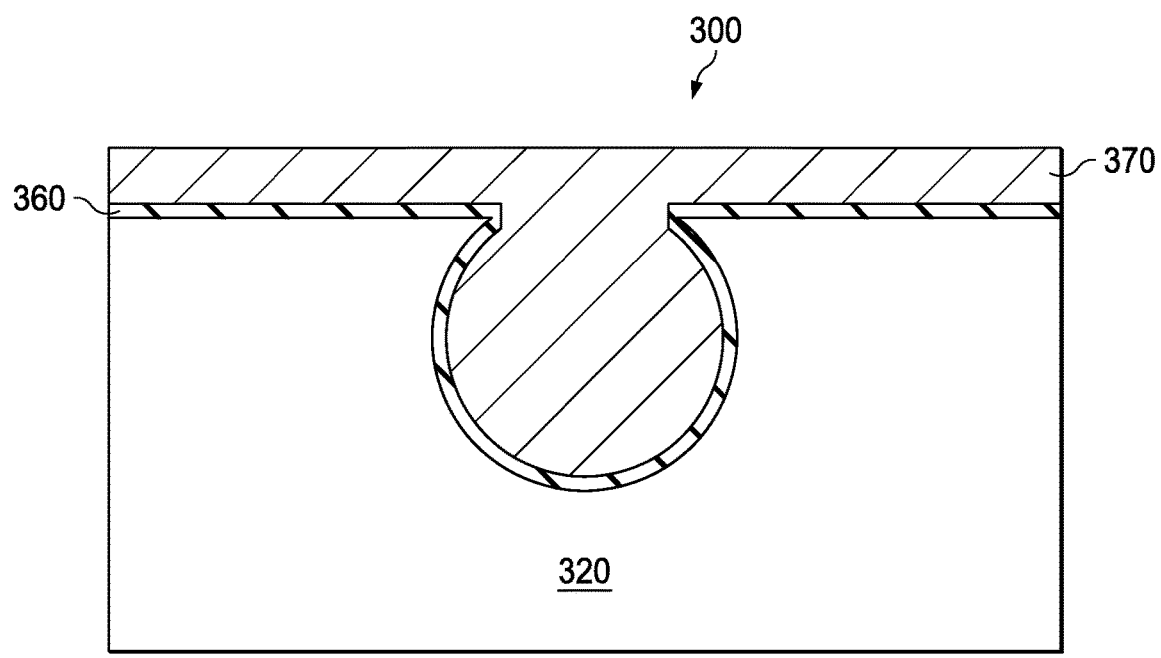

In FIG. 3i, the extended opening 328 may be filled with a conductive material 370. The conductive material 370 may be copper (Cu), copper alloys or aluminum (Al) or combinations thereof.

In one embodiment a conductive seed layer is formed or sputtered onto the barrier layer 360. The seed layer may cover the upper surface of the barrier layer 360 including the surface of the barrier layer in the upper part of the extended opening 328. The extended opening 328 is then completely filled with the conductive material. The extended opening 328 may be filled through an electro-plating process or an electroless-plating process. In one embodiment a copper (Cu) seed layer is first formed in the extended opening 328 and the extended opening is then filled with a Cu electro-plating process. In one embodiment the extended opening 328 is filled with a conductive material using a CVD process.

Figure 3J:
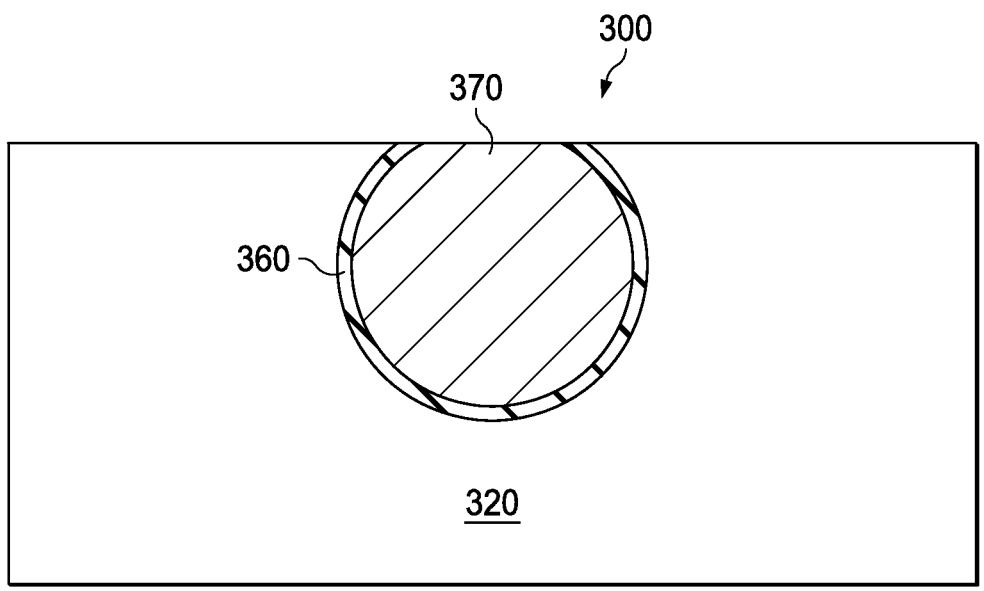

Conductive material formed outside of the extended opening 328 may be removed applying a chemical mechanical polishing (CMP) process, and a coil is formed in the isolation layer 320 as shown in FIG. 3j.

FIGS. 3a-3j only show the formation of a single coil winding in the isolation layer 320. However, the disclosed process covers also the formation of all windings in a coil as well as a plurality of coils in an isolation layer on a wafer, for example.

Figure 5:
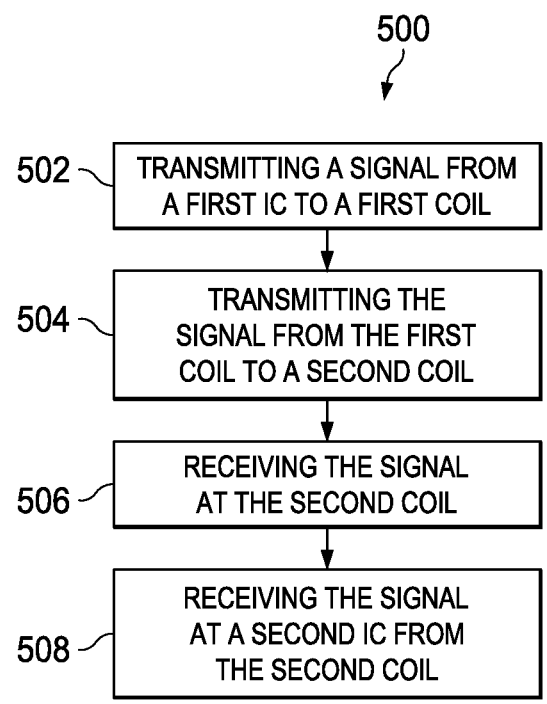
FIG. 5 shows an embodiment of a method of operating a coreless transformer.

FIG. 5 shows a flowchart 500 of signal being transmitted over a transformer. In a first step 502, the signal is transmitted from a first integrated circuit to a first coil. The first integrated circuit may comprise a transmitter. In the next step 504, the signal is transmitted from the first coil to the second coil. In one embodiment at least one coil of the transformer comprises a cross-section having a cross sectional surface as described with respect to FIGS. 4a and 4b. In another embodiment at least one coil of the transformer comprises a substantially circular circumference or substantially oval circumference in a cross section view. In yet other embodiments the at least one coil of the transformer comprises a curved shape in a cross sectional view. The curved cross sectional shape may be defined as free from angularity, as a continuously bending line without angles, as having no edges, or as being substantially round, substantially elliptical, substantially oval or substantially circular. In the next step 506 the signal is received at the second coil and in the final step, 508, the signal is received at the second integrated circuit. The second integrated circuit may comprise a receiver.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A transformer formed over a semiconductor substrate, the transformer comprising:
   an isolation layer disposed on the semiconductor substrate, wherein the isolation layer comprises a homogeneous continuous dielectric material extending between a top surface of the isolation layer and a bottom surface of the isolation layer, and wherein the top surface of the isolation layer is planar;
   a first coil disposed in a bottom half of the isolation layer; and
   a second coil disposed above the first coil in a top half of the isolation layer that is galvanically isolated from the bottom half of the isolation layer, wherein the transformer is a coreless transformer, wherein the isolation layer, the first coil, and the second coil are part of the coreless transformer, and wherein the second coil comprises
      an upper section comprising first sidewalls that are vertical and straight along a vertical cross section, and
      a lower section comprising second sidewalls that are curved and concave along the vertical cross section, wherein the lower section comprises an upper region comprising a first radius of curvature and a lower region comprising a second radius of curvature that is the maximum radius of curvature of the lower region, wherein the first radius of curvature is larger than the second radius of curvature.

2. The transformer according to claim 1, further comprising a barrier layer disposed between the second coil and the isolation layer, wherein the barrier layer directly contacts the second sidewalls of the second coil.

3. The transformer according to claim 1, further comprising an integrated circuit disposed in the semiconductor substrate.

4. The transformer according to claim 1, wherein the first coil is substantially aligned with the second coil.

5. The transformer according to claim 4, wherein at least one of the first coil and the second coil comprise copper or aluminum.

6. The transformer of claim 1, wherein the first coil comprises aluminum, and wherein the second coil comprises copper.

7. The transformer of claim 1, wherein the second sidewalls have a radius of curvature that is the same for at least about 180 degrees.

8. The transformer of claim 1, wherein the second sidewalls have a radius of curvature of the lower region that is the same for at least one of a lower region for at least about 90 degrees and that is different than a radius of curvature of the upper region.

9. A semiconductor structure comprising:
   a first coil supported by a substrate;
   a dielectric layer disposed over the substrate and the first coil;
   an opening in the dielectric layer comprising a concave surface, the opening comprising a first width at a top surface of the dielectric layer and a second width at a central region of the opening, wherein the first width is smaller than the second width; and a spacer disposed over the top surface of the dielectric layer and extending vertically towards the substrate through the opening, wherein the spacer comprises a first vertical major surface that is facing the opening and a second vertical major surface that is facing the dielectric layer, and wherein the first vertical major surface and the second vertical major surface are exposed up to the top surface of the dielectric layer.

10. The semiconductor structure of claim 9, wherein the dielectric layer is a single dielectric layer.

11. The semiconductor structure of claim 9, wherein the spacer comprises polycrystalline silicon.

12. The semiconductor structure of claim 9, wherein the spacer comprises silicon oxide.

13. The semiconductor structure of claim 9, wherein the spacer comprises silicon nitride.

14. The semiconductor structure of claim 9, wherein the spacer comprises photoresist.

15. The semiconductor structure of claim 9, wherein the spacer comprises a metal.

16. The semiconductor structure of claim 9, wherein the concave surface comprises a lower region having a first radius of curvature and an upper region having a second radius of curvature, the first radius of curvature being larger than the second radius of curvature.

17. A coreless transformer comprising:
a semiconductor substrate;
a patterned isolation region disposed over the semiconductor substrate, wherein the patterned isolation region comprises a homogeneous continuous dielectric material extending between a top surface of the patterned isolation region and a bottom surface of the patterned isolation region, and wherein a top surface of the patterned isolation region is planar;
a first primary coil and a second primary coil disposed completely within a top half of the patterned isolation region; and
a first secondary coil and a second secondary coil disposed within a bottom half of the patterned isolation region, wherein the first primary coil is electromagnetically coupled with the first secondary coil, wherein the second primary coil is electromagnetically coupled with the second secondary coil, wherein the patterned isolation region, the first primary coil, the second primary coil, the first secondary coil, and the second secondary coil are part of the coreless transformer, and wherein the first primary coil and the second primary coil each comprise
an upper section comprising first sidewalls that are vertical and straight along a vertical cross section, and
a lower section comprising second sidewalls that are curved and concave along the vertical cross section, the lower section comprising an upper region and a lower region, wherein the upper region comprises a continuously changing first radius of curvature, wherein the lower region comprises a continuously changing second radius of curvature, wherein an average rate of change of the continuously changing first radius of curvature is smaller than an average rate of change of the continuously changing second radius of curvature, and wherein the first primary coil and the second primary coil are circular in shape in a top view.

18. The coreless transformer of claim 17, wherein a top width of the first primary coil and the second primary coil along the vertical cross section is smaller than a central width of the first primary coil and the second primary coil along the vertical cross section.

19. A coreless transformer formed over a semiconductor substrate, the coreless transformer comprising:
an isolation layer disposed on the semiconductor substrate, wherein the isolation layer comprises a homogeneous continuous dielectric material extending between a top surface of the isolation layer and a bottom surface of the isolation layer, and wherein a top surface of the isolation layer is planar;
a first coil disposed under the isolation layer within the semiconductor substrate; and
a second coil disposed above the first coil and completely in a top half of the isolation layer, wherein the top half of the isolation layer is galvanically isolated from a top surface of the semiconductor substrate comprising the first coil, wherein the isolation layer, the first coil, and the second coil are part of the coreless transformer, and wherein the second coil comprises
an upper section comprising first sidewalls that are vertical and straight along a vertical cross section, and
a lower section comprising second sidewalls that are curved and concave along the vertical cross section, wherein the second sidewalls comprise a point, an upper region having a first volume above the point, and a lower region having a second volume below the point, wherein a tangent line drawn at the point is vertical, and wherein the first volume is smaller than the second volume.

* * * * *

UNITED STATES PATENT AND TRADEMARK OFFICE
CERTIFICATE OF CORRECTION

| | | |
|---|---|---|
| PATENT NO. | : 9,780,161 B2 | Page 1 of 1 |
| APPLICATION NO. | : 14/837880 | |
| DATED | : October 3, 2017 | |
| INVENTOR(S) | : Markus Menath | |

It is certified that error appears in the above-identified patent and that said Letters Patent is hereby corrected as shown below:

In the Claims

In Column 12, Line 56, Claim 8, delete "for at least one of a lower region".

Signed and Sealed this
Tenth Day of April, 2018

Andrei Iancu
*Director of the United States Patent and Trademark Office*